United States Patent [19]
Pace

[11] 3,932,879
[45] Jan. 13, 1976

[54] BILATERALLY CONDUCTING ZENER DIODE AND CIRCUIT THEREFOR
[75] Inventor: Wilson David Pace, Tempe, Ariz.
[73] Assignee: Motorola, Inc., Chicago, Ill.
[22] Filed: July 17, 1974
[21] Appl. No.: 489,191

[52] U.S. Cl. .................. 357/13; 357/20; 357/36; 357/39; 357/86; 322/28 T
[51] Int. Cl.² ............ H01L 29/90; H01L 29/06; H01L 29/747; H02H 7/06
[58] Field of Search ............ 357/13, 20, 36, 39, 52, 357/86

[56] References Cited
UNITED STATES PATENTS
3,462,656  8/1969  Gerstner et al. .............. 357/13
3,633,052  1/1972  Hanna ........................ 357/13

*Primary Examiner*—John S. Heyman
*Assistant Examiner*—E. Wojciechowicz
*Attorney, Agent, or Firm*—Harry M. Weiss; Henry T. Olsen

[57] ABSTRACT

A bilateral zener diode is described having improved terminal characteristics including a low noise factor, a predictable breakdown voltage level in the reverse breakdown mode within plus or minus 3 percent, and providing a sharp reference voltage which is substantially independent of diode current. This bilateral conducting diode is achieved by utilizing a collector ring diffusion of the same conductivity type as the anode diffusion, but spaced from both the anode diffusion and the cathode diffusion. In the forward bias conduction mode, the flow of current from the anode to the cathode is collected by the collector ring and returned to the cathode providing a forward transfer efficiency which is typically 90 percent.

5 Claims, 10 Drawing Figures

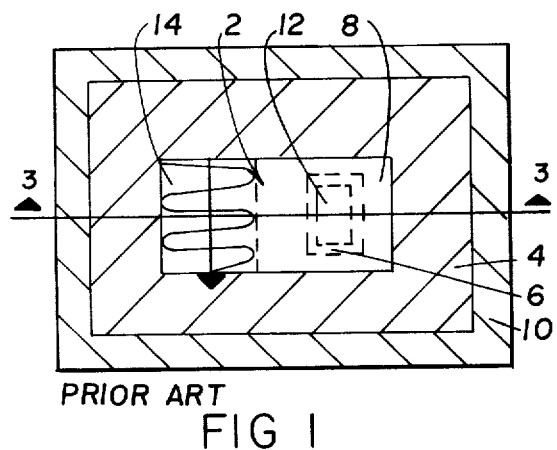
PRIOR ART
FIG 1
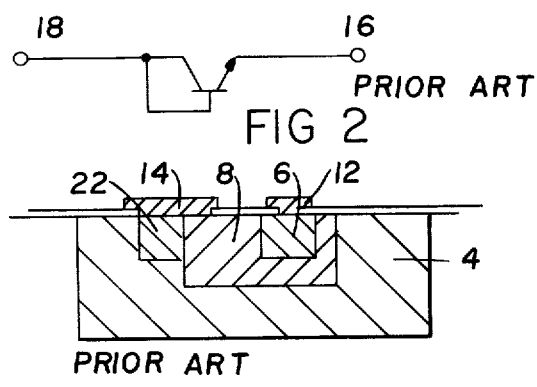
PRIOR ART
FIG 2
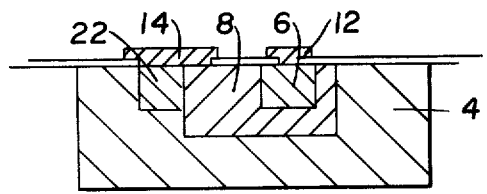
PRIOR ART
FIG 3
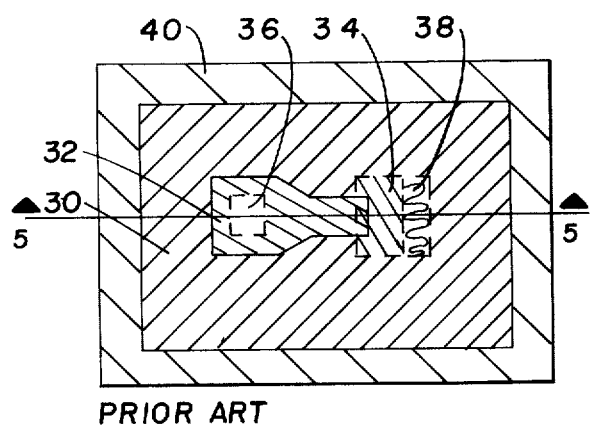
PRIOR ART
FIG 4
FIG 5
PRIOR ART
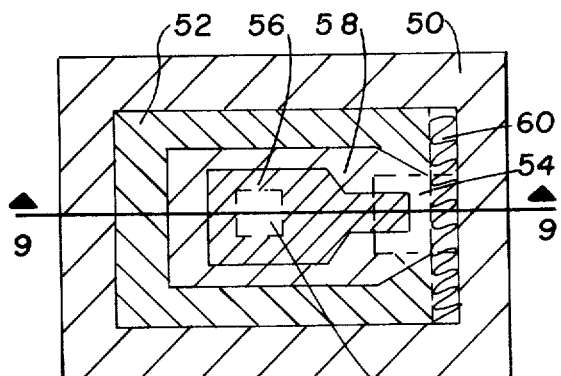
PRIOR ART
FIG 6
FIG 7
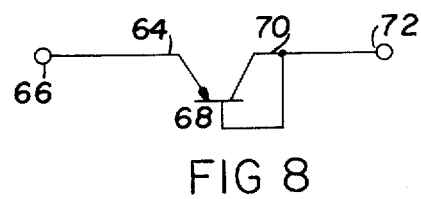
FIG 8
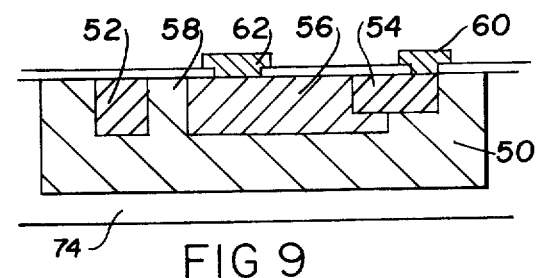
FIG 9
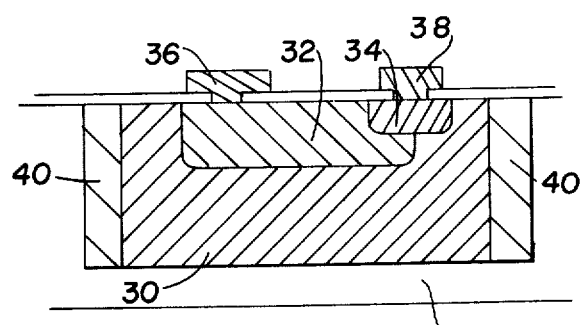

BILATERALLY CONDUCTING ZENER DIODE AND CIRCUIT THEREFOR

BACKGROUND OF THE INVENTION

There are many different forms of prior art zener diode construction and each one attempts to achieve improved circuit characteristics including the following general classes. A sharp reference voltage breakdown is desired as the prime function of the zener diode. This reference voltage level should be predictable, and should be nearly independent of diode current. A zener diode should have a low noise performance characteristic which minimizes the broad band noise normally generated by a zener diode. This broad band noise is detrimental to the operation of the circuit because many times it is coupled to the output and provides a noise characteristic at the output terminals. A zener diode for special circuit operations should be bilaterally conducting insofar as it not only operates in the reverse breakdown mode for generating a reference voltage, but it also operates as a forward biased rectifying diode. Most prior art zener diodes which operated in the forward biased direction possessed an extremely low current transfer efficiency from the anode to the cathode. In the prior art devices, this transfer efficiency was no greater than 10 percent. The current flowing from the anode to the cathode escapes to the substrate and is not collected by the cathode.

An additional characteristic of a zener diode is that the required reverse breakdown current drawn in the DC state should be kept as low as possible so as to reduce the standby current drain from the battery when the zener diode is operating in an automobile within the battery regulator. In all other environments, a low standby current reduces temperature of the device by reducing power dissipation in the device.

In the prior art, an NPN transistor is used as a zener diode in order to achieve bilateral conduction. However, such an NPN transistor uses the emitter-base junction operated in the reverse breakdown mode as the zener junction. Such a device, when operating as a zener diode, has two basic drawbacks. First, to achieve the low noise and provide a solid reference voltage, the reverse breakdown current must be very large. These large currents are measured in the milliamps and such a current creates a temperature problem on an IC chip which must dissipate heat generated in the zener diode. When the current flow is reduced to avoid the temperature problems, the reference voltage level is no longer predictable, but rather, it varied within the range of ten percent of its design value. A low current flow of 100 microamps in an NPN transistor still resulted in a 3 millivolt RMS noise signal, as the typical noise signal, at the output terminal. Accordingly, such an NPN transistor connected as a zener diode provides a poor reference voltage standard as well as provides a high noise term on the reference voltage.

The prior art also teaches the use of a zener diode using the finger emitter design for achieving high current density with a low reverse current. While this construction gives a low noise at a reasonably low current, it is a poor device for operating in the bilateral conduction mode. The transfer efficiency from the anode to the cathode is again less than 10 percent.

OBJECTS OF THE INVENTION

The present invention relates generally to integrated circuit apparatus and, more particularly, to a novel integrated circuit bilaterally conducting zener diode having a low noise characteristic and a predictable breakdown voltage, in the reverse breakdown mode, which is substantially independent of diode current.

It is an object of the present invention to provide a bilaterally conducting zener diode.

Another object of the present invention is to provide a bilaterally conducting zener diode having a low noise characteristic and having a predictable breakdown voltage in the reverse breakdown mode at a low reverse breakdown current.

A still further object of the present invention is to provide a bilaterally conducting zener diode which is able to provide the reference voltage level substantially independent of diode current.

Another object of the present invention is to provide a bilaterally conducting zener diode which maximizes current density across the junction of the diode when operated in the reverse breakdown region in that area where current flows from anode to cathode by utilizing the finger anode type construction.

A still further object of the present invention is to provide a bilaterally conducting zener diode wherein the anode region protrudes into the cathode region as a finger structure and wherein a collector ring is diffused around the anode for operating as a means for collecting all the anode current flowing from the anode to the cathode when the zener junction is forward biased.

Another object of the present invention is to provide a bilaterally conducting zener diode utilizing a diffused collector ring surrounding the anode region for collecting the anode current as it flows outwardly from the anode region.

SUMMARY OF THE INVENTION

The present invention is directed to a zener diode wherein the anode region of the diode appears as a finger-like projection into the cathode region for maximizing the current density flow across the zener PN junction thereby achieving improved noise performance. Such a combination is well-known in the prior art as it is fully described at Page 369 of an IEEE Journal of Solid State Circuits, Vol. SE-6, December, 1972, beginning at Page 366.

Such a finger zener diode has a very poor bilateral conducting characteristic when operated in the forward biased mode. The transfer efficiency of current flowing from the anode to the cathode is less than ten percent of the total current flowing. This occurs because the current flowing from the anode to the cathode is collected by the substrate and it is no longer available as part of the anode-cathode current flow.

The present invention corrects this defect in the prior art finger zener diode design by adding a diffused region surrounding the anode region and spaced close to the cathode region for collecting the current flowing out of the anode and returning it to the cathode terminal. By adding the collector ring, the transfer efficiency is improved to typically 90 percent.

DESCRIPTION OF THE DRAWINGS

FIG. 1 is a top view of a prior art zener diode comprising an NPN transistor connected as a zener diode.

FIG. 2 is a schematic drawing showing the connection of the NPN transistor as a zener diode.

FIG. 3 shows a cross-sectional view taken along the line 3—3 in FIG. 1.

FIG. 4 shows a top view of the prior art finger zener diode.

FIG. 5 shows the cross-sectional view taken along the line 5—5 of FIG. 4.

FIG. 6 is a schematic drawing of the finger zener diode.

FIG. 7 shows a top view of the zener diode made according to the present invention.

FIG. 8 shows a schematic view of the zener diode shown in FIG. 7.

FIG. 9 shows a cross-sectional view of the zener diode shown in FIG. 7 taken along the line 9—9.

DETAILED DESCRIPTION OF THE INVENTION

Figure 10:
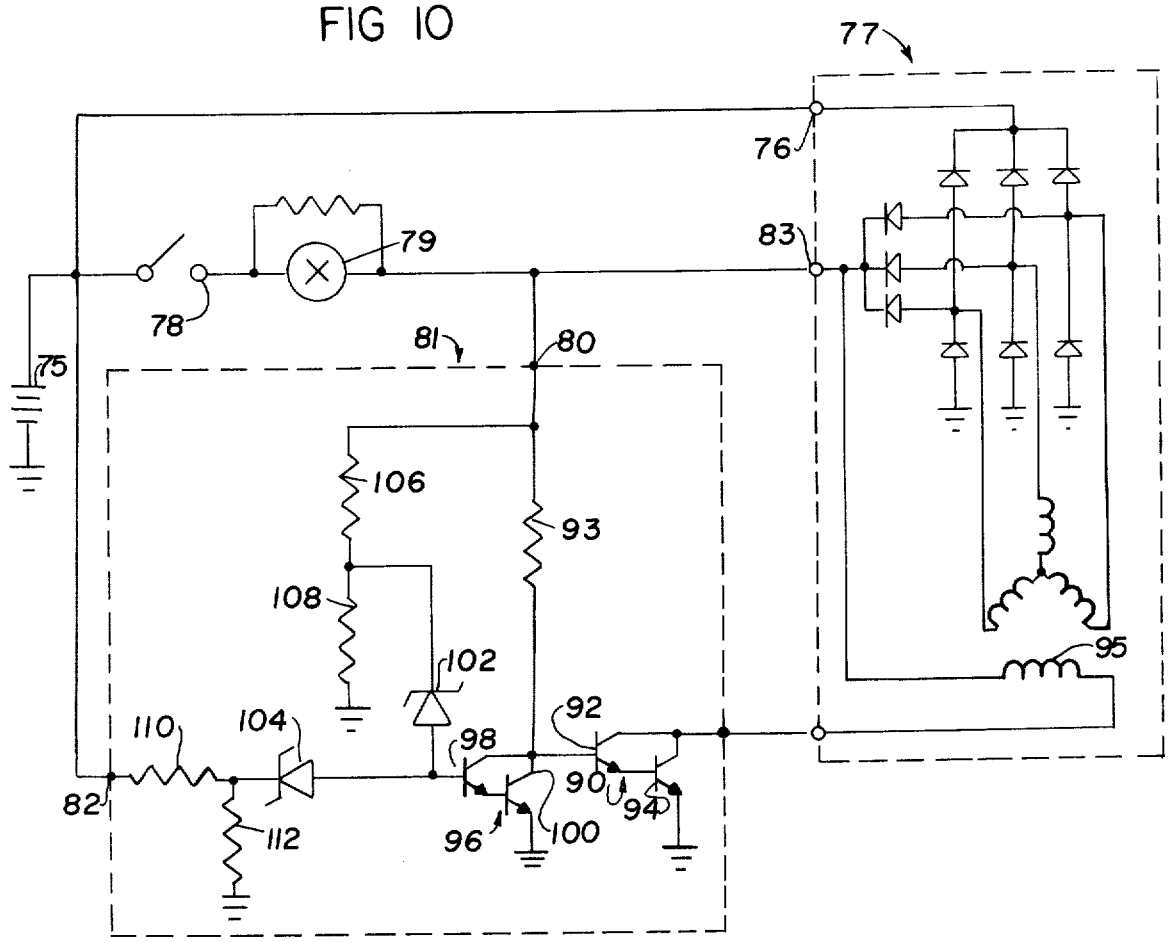
FIG. 10 shows a circuit diagram of an automotive voltage regulator utilizing zener diodes as described herein.

Referring to FIG. 1, there can be seen the top view of an NPN transistor connected as a zener diode. The NPN transistor is generally indicated by the reference numeral 2 and is positioned within an epi tub 4. The NPN transistor diode includes a cathode diffusion at 6, an anode diffusion at 8, and a junction isolation diffusion indicated at 10. Corresponding portions of an NPN transistor would be the collector as represented by the region 4, the base by the region 8 and the emitter represented by the region 6. The cathode contact is shown at 12, and the anode contact is shown at 14.

Referring to FIG. 2, there is shown a schematic representation of the structure shown in FIG. 1. The emitter is shown connected to an output terminal 16 which corresponds to the cathode terminal 12 of the zener diode. The base terminal is connected to the collector terminal and their junction is connected to a second output terminal 18 which corresponds to the anode terminal 14 of the zener diode.

Referring to FIG. 3, there is shown the cross-sectional view showing the diffusion made into a substrate 20 to form the NPN transistor configuration. Similar regions will be given the same identifying numbers. The collector region or epi tub is shown at 4. The cathode or emitter region is shown at 6, and the base or anode diffusion is shown at 8. At the same time that the emitter diffusion 6 is made, a diffusion is also made at 22 so as to short the collector-base junction by the anode contact shown as 14. The cathode contact is shown at 12.

This prior art NPN transistor connected as a zener diode is able to provide both a low noise factor and a solid reference voltage output only when using large currents. These large currents are greater than one milliamp. However, such a large current as this causes high thermal temperatures to exist within the chip. Therefore, from a thermal viewpoint, an NPN transistor connected as a zener diode is undesirable. When the current flow is reduced to the range of ½ milliamp or below, the output characteristics of the circuit are unpredictable and typically suffer with 10 percent variation in breakdown voltage as standard and a three millivolt RMS noise signal superimposed on the reference voltage available at the cathode terminal.

Referring to FIG. 4, there is shown a top view of the finger zener diode which is well-known in the prior art. The epi tub is shown at 30 having an anode diffused region at 32 and the cathode diffused region at 34, respectively. The anode contact is shown at 36 while the collector contact is shown at 38, respectively. A junction isolation diffusion encircles the structure and is shown at 40.

Referring to FIG. 5, there is shown a cross-sectional view of the device shown in FIG. 4, taken along the line 5—5. The P type substrate is shown at 42 having the P type junction isolation diffusion at 40. The N type epi tub is shown at 30, while the anode is shown at 32. The cathode is shown at 34. The anode contact is shown at 36, while the cathode contact is shown at 38. While this finger diode structure is well known in the prior art for its ability to maximize current density and give low noise factor at the output reference voltage, it is a poor bilaterally conducting structure. When a finger zener diode is used as a rectifying diode in the forward biased direction, only 10 percent of the anode current flow reaches the cathode terminal. Accordingly, a finger zener of the design shown in FIGS. 4 and 5, is not suitable for use in that application wherein the zener diode is needed to be used not only as a reference voltage generator, but also as a rectifying diode operated in the forward biased direction.

FIG. 6 shows the schematic view of the finger zener diode.

Referring to FIG. 7, there is shown the zener diode of the present invention. The zener diode of the present invention includes an N type epi isolation region at 50, a collector ring diffusion at 52. The cathode region is at 54 and the anode region is shown at 56. The anode is separated from the collector ring by a portion of the N type epi region at 58. The cathode contact is shown at 60, and is in contact to both the collector ring and the cathode region. The anode contact is shown at 62.

Referring to FIG. 8, there is shown the schematic view of the connection of the structures shown with reference to FIG. 7. The emitter electrode 64 provides the anode terminal at 66. The base electrode 68 is connected to the collector electrode 70, and together they provide the cathode terminal at 72.

Referring to FIG. 9, there is shown a cross-sectional view of the structure shown in FIG. 7 taken along the line 9—9. The P-substrate is shown at 74 while the epi isolation region is shown at 50. The anode diffusion is shown at 56 while the cathode diffusion is shown at 54. The anode contact is shown at 62 while the cathode contact is shown at 60. The collector diffusion ring is shown at 52. The region of the epi isolation pocket separating the collector diffusion ring from the anode is shown at 58.

The important addition to the prior art structure as shown with reference to FIG. 7, is the addition of a collector ring 52 which is positioned adjacent to the cathode diffused region and spaced from the anode region. When the current in the forward biased direction from the anode to the cathode leaves the anode region, it diffuses in all directions from the anode. Accordingly, in a normal zener diode configuration, the anode current flowing everywhere except at the anode-cathode junction is lost to the substrate thereby reducing the transfer efficiency of the device. In the present invention, the collector ring surrounds the anode and is in a form similar to a lateral PNP, the collector ring diffusion collects all the radiated anode current and returns it to the cathode contact. This improves the transfer efficiency to 90 percent of the anode-cathode current flow.

The collector ring 52 may surround less than substantially all of the anode as shown in FIG. 7. To the extent that less than all of the anode is surrounded, then there will be a reduction in current transfer efficiency from the anode to the cathode as some of the current will not be collected.

The collector ring is electrically joined to the cathode region by the contact 60. Accordingly, the diffusion forming the ring 52, in a second embodiment (not shown), may contact the cathode region and the device continues to operate satisfactorily. In this second embodiment, the only change is that the collector ring is spaced a little further away from the anode in the region near the cathode region.

The device configuration shown in FIGS. 7, 8 and 9, results in a bilaterally conducting zener diode having both the low noise characteristic of a finger diode, as well as a predictable breakdown level in the reverse breakdown mode. Such a device provides the reference voltage level substantially independent of the diode current. In addition to these characteristics, the device is a true bilaterally conducting diode having a transfer efficiency in the forward biased direction of anode to cathode of 90 percent.

Referring to FIG. 10, there can be seen a schematic diagram of a typical voltage regulator used in an automotive environment. The automobile battery is represented at 75 having its positive terminal connected directly to the BATT. terminal 76 of the alternator represented by a typical alternator schematic diagram 77. The battery 75 is also connected to an ignition switch 78, an alternator warning light 79 to a first terminal 80 of a switching regulator indicated at 81. The normal battery input voltage signal is applied to a second terminal 82 of the voltage regulator system. A second input signal is provided to the terminal 80. The signal available at terminal 80 is the output of diode trio of the alternator. In an automobile environment the connection from the battery 75 to the terminal 82 is frequently broken. The regulator is then controlled by the signal from the diode trio.

The voltage regulator comprises a first Darlington circuit indicated generally at 90 and comprising a first transistor 92 and a second transistor 94. The base electrode of the first transistor 92 is connected to the one side of a resistor 93 and the collector electrode of the first transistor 92 is connected to the collector electrode of the second transistor 94 and both of these are connected to one side of an alternator field coil 95. The emitter electrode of the first transistor 92 is connected to the base electrode of the second transistor 94 and the emitter electrode of the second transistor is connected to ground.

A second Darlington circuit is shown as 96 comprising a first transistor 98 and a second transistor 100. The collector of the first transistor 98 is connected to the collector electrode of the second transistor 100 and both of these electrodes are connected to the junction of the base electrode of the transistor 92 and one side of the resistor 93. The emitter electrode of the transistor 98 is connected to the base electrode of the transistor 100 and the emitter electrode of the transistor 100 is connected to ground. The base electrode of the transistor 98 is connected to an anode electrode of a first zener diode 102 and to an anode electrode of a second zener diode 104. The cathode electrode of the zener diode 102 is connected to the junction of a first resistor 106 and a second resistor 108. The other side of the resistor 108 is connected to ground. The other side of the resistor 106 is connected to the junction of the input terminal 80 and the other side of the resistor 93. The cathode electrode of the zener diode 104 is connected to the junction of a third resistor 110 and a fourth resistor 112. The other side of the resistor 112 is connected to ground, while the other side of the resistor 110 is connected to the input terminal 82.

In operation, a 12 volt battery 75 is kept fully charged by maintaining a 14 volt charging voltage across the battery at all times. This is the recommended charging voltage for such a 12 volt battery. It is desirable that this charging voltage does not exceed 14 volts because any excessive voltage causes internal currents to flow in the battery which will damage the battery by excessive heat. Accordingly, a design limitation is to maintain a 14 volt charging voltage across the battery 75. This 14 volt charging voltage is desired regardless of whether or not the headlights of the automobile are on or off or whether the car is idling or racing. For 6 volt battery, or a battery of any rating, the zener diodes operate the same. The alternator is different.

The resistor 93 is connected to the positive side of the battery 75 and current flows through resistor 93 when the ignition switch 78 is closed to provide drive current to transistor 92. This drive current turns on the Darlington pair 90. When the Darlington pair 90 is turned on, current is pulled through the field coil 95 and the alternator responds by providing additional voltage across the battery by the BATT. connection 76. Accordingly, the voltage across the battery is continuously increased on demand of the bias current flowing into the base electrode of the transistor 92. In order to reduce this charging voltage across the battery 75, the bias current through the resistor 93 must be diverted through the transistor 100 to ground.

In order to divert the current through the transistor 100, the Darlington pair 96 must be turned on. This Darlington pair is turned on in response to a suitable signal at either one of the input terminals 80 or 82. In the normal mode of operation, when the voltage across the battery 75 is of a suitable magnitude, i.e., 14 volts, the current flowing in the resistors 110 and 112 reverse biases the zener diode 104 causing a voltage level equal to two base emitter drops to be applied to the base electrode of transistor 98. This is the normal mode of operation when the connections between the input terminal 82 and the battery is available. However, this connection is often broken and voltage regulation becomes difficult as described hereinafter. This voltage at the base of the transistor 98 is sufficient to turn on the Darlington pair 96, thereby taking the current from the base of transistor 92 and by-passing it to ground through the transistor 100.

The system operates in the same manner in response to a signal applied to the terminal 80. A current flows in resistors 106 and 108 and provides a reverse breakdown voltage level to the zener diode 102. The zener diode provides a control signal to the base of the transistor 98 turning on the Darlington pair 96 and by-passing the current through the resistor 82 to ground. The control signal applied to the base of transistor 98 is also at a level equal to two base-emitter drops.

In this normal mode of operation, it is important to note that the Darlington pair 96 is only caused to conduct when the base electrode of the transistor 98 is raised to a voltage level equal to at least two base emitter voltage drops. One base emitter drop is required to forward bias transistor 98 and the second base emitter drop is required to forward bias transistor 100. Accordingly, the base electrode of the transistor 98 must be raised to a voltage level of at least two base-emitter drops before the Darlington pair 96 is turned on.

In the event that either of the input signals available at terminals 80 or 82 is disconnected, then the system is subject to harm unless the Darlington pair 96 can be turned on for diverting the drive being pulled through the field coil 95.

In the automotive regulator, the main reason for the zener diode 104 to be bilaterally conducting is to handle that situation when the connection to the battery 75 is broken and the regulator loses its signal at input terminal 82. When the signal at terminal 82 is lost, the regulator responds to the voltage available at terminal 80 supplied by the diode tria terminal 83 of the alternator. The voltage at terminal 80 provides a current through resistor 93 and forward biases transistor 92 pulling current through coil 95. The alternator responds by generating a higher voltage at its BATT. terminal 76 for application to the battery 75. A correspondingly higher voltage is available at terminal 80. Since the connection is broken at terminal 82, the higher voltage across the battery is not available to forward bias the transistor 98 through the path including the zener diode 104. Accordingly, the voltage at terminal 80 must be used to turn on transistor 98. In this situation, the new current path for providing a voltage level of two base-emitter voltage drops is from terminal 80, through resistor 106, through the zener diodes 102 and 104 and resistor 112 to ground. In this path, the zener diode 104 must be a bilaterally conducting diode having high transfer efficiency in the forward bias mode from the anode to the cathode for creating a voltage level of at least two base-emitter drops at the base of transistor 98.

The current flow from the diode trio terminal 80 is through the resistors 106 and 108 to ground for creating a reverse bias voltage at the cathode of zener diode 102. When the reverse breakdown voltage is reached and the zener diode 102 conducts in the reverse breakdown mode, current flows towards the base of transistor 98. However, before the Darlington pair 96 can conduct, the voltage at the base of transistor 98 must be two base emitter drops above ground. The current path now includes the zener diode 104, conducting in the forward direction. Current will flow through zener diode 104, when a voltage level of one base-emitter voltage drop is available. Therefore, the biasing current for transistor 98 is diverted away from the base of transistor 98 and flows through diode 104. The current from the zener diode 102 flows through the zener diode 104 and then to ground through the resistor 112. When the zener diode 104 is a poor conductor in the forward bias mode, only a fraction of the current flowing into the anode reaches the cathode and hence, can flow to ground through the resistor 112. Hence, if a certain amount of current is necessary to flow through resistor 112 before the two base emitter drop voltage level is available at the base of the transistor 98, then the current flow through the zener diode 104 must increase until this voltage is available at the base electrode. In the prior art, the transfer efficiency or current flow from the anode to the cathode in the forward bias mode is only ten percent of the current flowing into the anode. Accordingly, the alternator field coil must put out an excessive amount of current and must raise the voltage on the battery to an excessive level and cause excessive amount of current to flow through the battery. The signal at terminal 80 must cause a current to flow into the zener diode 104 which is ten times greater than necessary to create a voltage level of one base-emitter voltage across the resistor 112.

A zener diode of the present invention when placed in position of the zener diodes 102 or 104, transfers the current with much higher efficiency from the anode to the cathode. The voltage at the junction of the resistor 112 and the cathode of zener diode 104 provides an additional one base emitter drop by the current flowing to ground through resistor 112. This one base emitter drop plus the one base-emitter drop provided by the forward biased zener diode 104 provides the two base-emitter drop to the base of transistor 98 required by the Darlington 96 to turn on the Darlington 96 and takes the bias current away from the Darlington 90 and thus reduce the voltage put out by the alternator.

The improved current transfer efficiency of the zener diode 104 causes more current to pass through the diode 104 at a lower voltage at terminal 80 to bring the regulator back into operation after the cable to the battery is broken and the lead at terminal 82 is broken.

The current transfer efficiency of the zener diodes 102 and 104 are sufficiently high that the switching regulator 81 is able to hold the charging voltage across the battery to near fourteen volts even when the battery connection to terminal 82 is lost. The charging voltage is set as fourteen volts by selecting the values of the resistors 106 and 108 and 110 and 112.

Various changes and modifications of the proposed embodiment of the invention described will be apparent to those of ordinary skill in the art, and it is intended that such changes and modifications are covered by the appended claims.

What is claimed is:

1. A bilaterally conducting zener diode, comprising:
    a semiconductor body of a first conductivity type,
    an anode region positioned within said semiconductor body and being of an opposite conductivity type;
    a cathode region positioned within said body and being of said first conductivity type and forming a P-N junction with said anode region; and
    a further region of opposite conductivity type surrounding said anode region and spaced close to said cathode region for collecting the current flowing out of said anode region and contact means for returning such current to the cathode region.

2. A zener diode as recited in claim 1 wherein a portion of said anode region extends under a portion of said cathode region.

3. A zener diode as recited in claim 1, and further comprising:
    a contact member connected to said cathode region and said further region.

4. A zener diode as recited in claim 1, wherein said further region surrounds less than all of said anode region.

5. A zener diode as recited in claim 1, wherein said cathode region is formed integral with said further region.

* * * * *